(12) United States Patent
Moronvalle et al.

(10) Patent No.: US 9,257,949 B2
(45) Date of Patent: Feb. 9, 2016

(54) LINEAR AMPLIFIER

(75) Inventors: Mathias Moronvalle, Vauhallan (FR); Pierre-Emmanuel Calmel, Versailles (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 13/582,312

(22) PCT Filed: Mar. 16, 2010

(86) PCT No.: PCT/FR2010/050470
§ 371 (c)(1),
(2), (4) Date: Nov. 26, 2012

(87) PCT Pub. No.: WO2011/107670
PCT Pub. Date: Sep. 9, 2011

(65) Prior Publication Data
US 2013/0063211 A1    Mar. 14, 2013

(30) Foreign Application Priority Data
Mar. 2, 2010    (FR) ...................................... 10 51518

(51) Int. Cl.
*H03F 3/30*    (2006.01)
(52) U.S. Cl.
CPC .................................. *H03F 3/3018* (2013.01)
(58) Field of Classification Search
CPC ....................................................... H03F 3/265
USPC .......................................... 330/262, 263, 264
See application file for complete search history.

(56) References Cited

U.S. PATENT DOCUMENTS

| | | | | |
|---|---|---|---|---|
| 3,947,727 A | * | 3/1976 | Stewart | 361/91.5 |
| 4,275,359 A | * | 6/1981 | Yoshida et al. | 330/251 |
| 6,646,508 B1 | * | 11/2003 | Barbetta | 330/264 |
| 7,477,104 B2 | * | 1/2009 | Kodera | 330/264 |

FOREIGN PATENT DOCUMENTS

| | | |
|---|---|---|
| DE | 279 128 | 5/1990 |
| JP | 53 074348 | 7/1978 |
| NL | 8 403 265 | 5/1986 |

OTHER PUBLICATIONS

International Search Report for PCT/FR2010/050473 dated Apr. 27, 2011.

* cited by examiner

*Primary Examiner* — Henry Choe
(74) *Attorney, Agent, or Firm* — Stephen J. Weyer, Esq.; Stites & Harbison, PLLC

(57) ABSTRACT

The invention relates to a "push-pull" amplifier, comprising an input (12) and an output (14), which includes: a main amplification branch comprising two amplification transistors (18, 20) connected in opposite series between two supply voltages (V+, V−), the amplifier output (14) being connected between the two transistors (18, 20), and a control circuit (22, 24) for each amplification transistor (18, 20) connected to the input (12) to each receive as an input the signal to be amplified. The main amplification branch comprises, between each transistor (18, 20) and the output (14), a member having a nonlinear response (38, 40) and means (30, 32) for introducing at the input of the control circuit (22, 24) of each transistor (18, 20), a nonlinear compensating signal suitable for bringing about the circulation of a minimum current in the member having a nonlinear response (38, 40).

8 Claims, 2 Drawing Sheets

LINEAR AMPLIFIER

Figure 1:
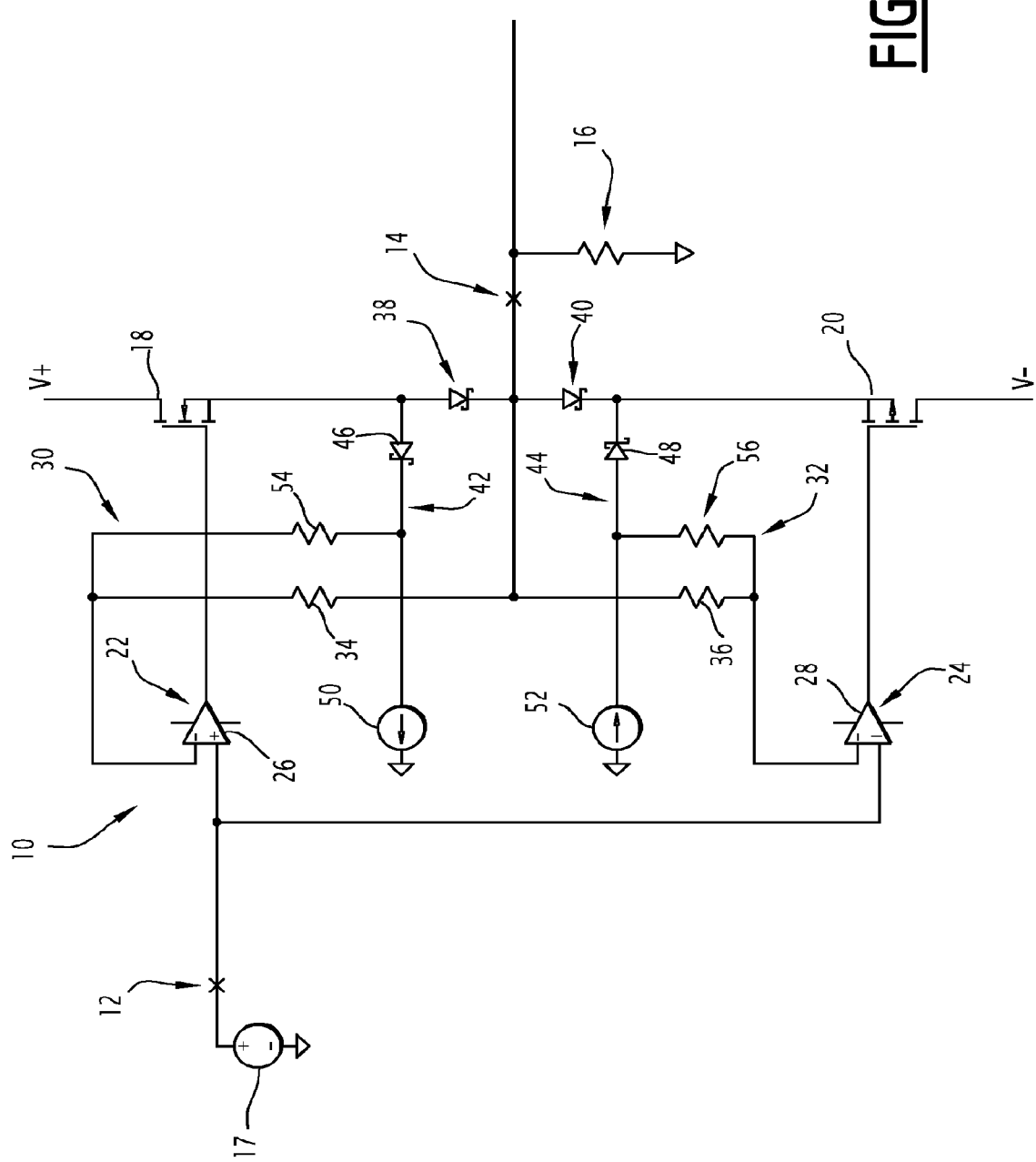

The present invention relates to an amplifier of the «push/pull» type, and notably an audio amplifier of class A, of the type including an input and an output comprising:
- a main amplification branch including two amplification transistors connected in opposite series between two supply voltages, the output of the amplifier being connected between both transistors, and
- a control circuit for each amplification transistor connected to the input so that each receives as an input the signal to be amplified.

Audio amplifiers are classified in several categories, which correspond to different amplification modes leading to different performances in terms of power and quality.

Class A amplifiers are such that the active amplification elements consisting of transistors are constantly conducting and therefore always operate in a linear mode. With this it is possible to obtain good quality of the output signal but the output power is limited.

On the contrary class B amplifiers include amplification elements which operate in a linear mode only during half the time and are substantially blocked during the other half of the time. These amplifiers suffer from switching distortions which are detrimental to the quality of the amplified signal.

Class AB amplifiers also exist in which, the amplification elements may switch from a conducting state to a blocked state so that the amplifier is actually of class A for low powers and of class B for higher powers. In this case, the power of the amplifier is relatively reduced in order to have strong linearity.

Finally, class D amplifiers are known in which the transistors operate in an «on/off» mode, and are controlled by pulse width modulation which depends on the signal to be amplified. The power of the amplifier is very high but the quality of the signal is often poor.

The object of the invention is to propose an amplifier of the «push/pull» type with which high power, an amplified signal of good quality and low static dissipation of energy may be obtained.

For this purpose, the object of the invention is an amplifier of the «push/pull» type of the aforementioned kind, characterized in that the main amplification branch includes, between each transistor and the output, a unit with a non-linear response and introduction means, at the input of the control circuit of each transistor, for a non-linear compensation signal able to impose flow of a minimum current in the unit with a linear response.

According to particular embodiments, the amplifier includes one or more of the following features:
- said unit with a non-linear response is a diode;
- said unit with a non-linear response is an MOS type transistor;
- the means for introducing the non-linear compensation signal include:
  - a second non-linear unit identical with said non-linear unit connected between a corresponding terminal of said non-linear unit and a current source imposing a current in the said second non-linear unit,
  - a voltage measurement branch connected to the other terminal of the second non-linear unit, which voltage measurement branch is connected to the control circuit in order to provide said non-linear compensation signal;
- means for introducing the non-linear compensation signal include:
  - a voltage source, a terminal of which is connected between each amplification transistor and the unit with a non-linear response, and
  - a voltage measurement branch connecting the other terminal of the voltage source to the control circuit of the transistor;
- the amplifier includes a linear feedback loop connecting the current output to the input of each control circuit;
- the voltage measurement branches and the linear feedback loop are connected together at the input of the control circuit;
- the value of the resistor of the voltage measurement loop is at least 100 times greater than the value of the resistor of the linear feedback loop; and
- each control circuit controls an operational amplifier, the non-inverting input of which is connected to the input of the amplifier and the inverting input of which is connected to the means for introducing the non-linear compensation signal.

Figure 2:
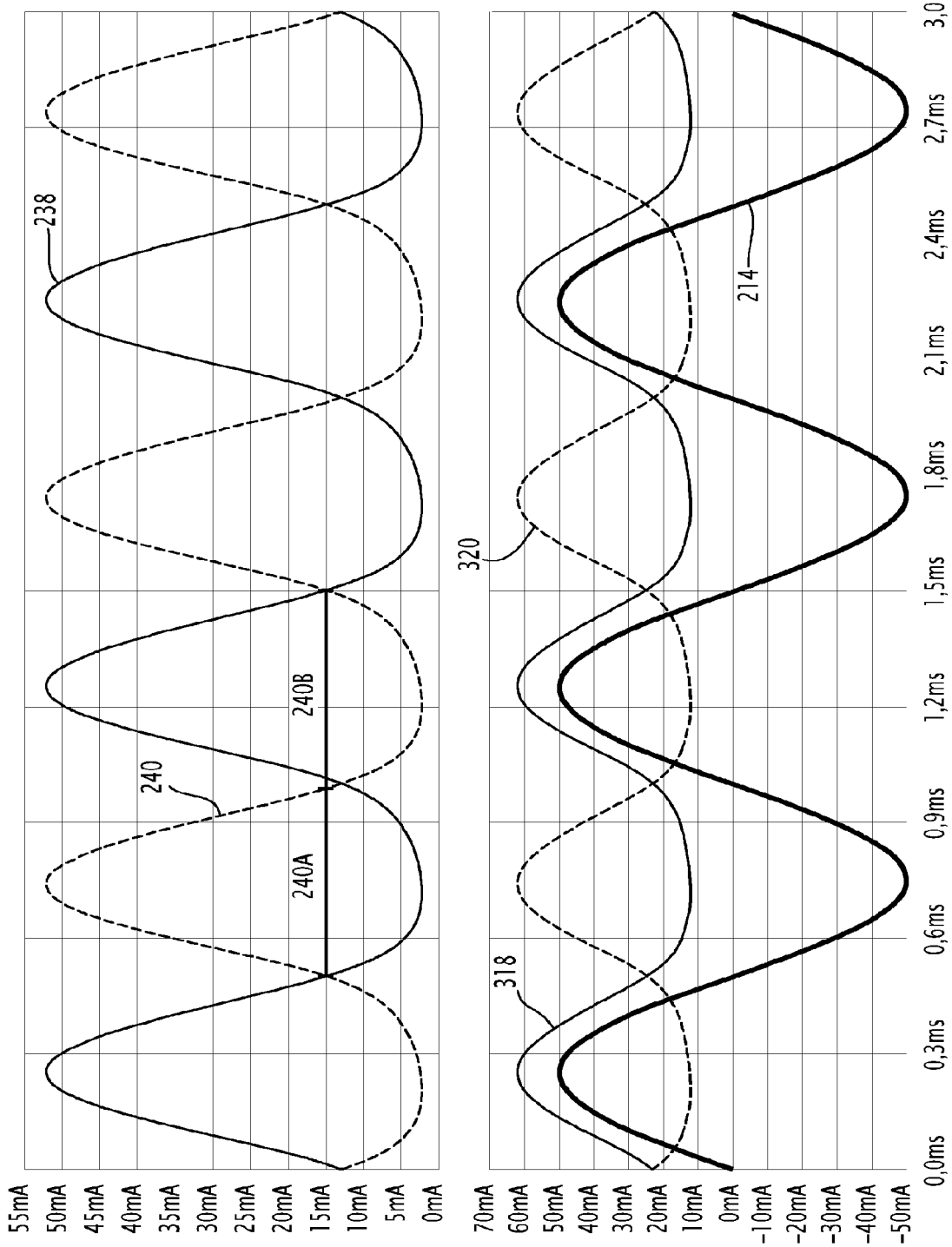

The invention will be better understood upon reading the description which follows, only given as an example and made with reference to the drawings wherein:

FIG. 1 is a diagram of the amplification circuit of the «push/pull» type according to the invention; and FIG. 2 is a view illustrating different currents in different points of the circuit of FIG. 1 and showing the non-blocking of the amplification elements.

As illustrated in FIG. 1, the amplifier 10 of the «push/pull» type according to the invention includes an input 12 for an audio signal to be amplified and an output 14 for the amplified signal.

This output 14 is connected to a loudspeaker 16 forming a load for the amplifier symbolized as a resistor. The input 12 of the amplifier is able to receive a control voltage, the reference of which is the ground and which stems from a sound reproduction system schematized by the generator 17 in FIG. 1.

As this is known per se, the «push/pull» amplifier includes two amplification transistors 18, 20 of the «MOSFET» type connected in opposite series along a main amplification branch connected between two buses of DC voltages $V^+$ and $V^-$. The drain of each transistor 18, 20 is respectively connected to the voltage $V^+$ and $V^-$ and the sources are connected together at the output of the amplifier 14.

The gate of each transistor 18, 20 is connected to the output of a control follower circuit 22, 24 each including an operational amplifier 26, 28, the non-inverting input is directly connected to the input 12 of the amplifier. A feedback loop 30, 32 is connected between the output 14 of the amplifier and the inverting output of the operational amplifier, 26, 28, respectively. These loops respectively include a resistor 34, 36 of the same value. This resistor is selected to have a relatively low value, preferably less than 1 MOhms and for example equal to 330 Ohms.

Further, and according to the invention, the main amplification branch includes, between the source of each transistor 18, 20 at the output 14 of the amplifier, a non-linear unit 38, 40 and means 42, 44 providing a reference voltage value at the terminals of the non-linear unit for introducing a non-linear compensation signal able to ensure flow of a current with a predetermined value in the non-linear unit 38, 40 of the main amplification branch.

According to a first embodiment, the non-linear units 38, 40 are each formed with a diode. The anode of the diode 38 is connected to the source of the transistor 18 and its cathode is connected to the output 14. Conversely, the anode of the diode 40 is connected to the output 14 and its cathode is connected to the source of the transistor 20.

The means for introducing a compensation signal 42, 44 are integrated into the feedback loop 30, 32 of the operational amplifiers 26, 28.

In the illustrated embodiment, they each include a diode 46, 48 respectively identical with the diode 38, 40 and laid out under installation conditions and notably thermal stress conditions identical with those of the diode 38, 40. This diode 46, 48 is connected to the drain of each transistor 18, 20 along an orientation identical with that of the corresponding diode 38, 40. Its other end is connected to a current source 50, 52 of opposite directions imposing through the associated diode 46, 48 a constant current of low intensity preferably less than 100 milliamperes and for example 10 milliamperes. Thus, the diode 46 has its anode connected to the anode of the diode 38, its cathode being connected to the current source 50 while the diode 48 has its cathode connected to the cathode of the diode 40, its anode being connected to the current source 52.

A coupling resistor 54, 56 respectively connects the cathode of the diode 46, and the anode of the diode 48 to the feedback loop 30, 32 of the operational amplifiers 26, 28 respectively. These resistors are able to inject into the feedback loop 30, 32 the voltage on the terminals of the diodes 46, 48.

Thus, the other terminal of the resistors 54, 56 is connected to the non-inverting input of the operational amplifiers 26, 28.

It is understood that during operation, the presence of the diodes 38 and 40 which form non-linear units prevents the intensity in the transistors 18 and 20 from being zero and this regardless of the output current of the amplifier. Indeed, when the current essentially flows through one of the transistors, the other transistor has an intensity flowing through it which is non-zero and which converges towards a current value equal to that of the current source 50, 52 because of the control imposed by the feedback loop on the current flowing in the non-linear unit in the main amplification branch.

The diodes 46, 48 through which flow the currents imposed by the current sources 50, 52, ensure the role of a reference with which it is possible to correct the control circuits of the transistors 18, 20 through the feedback loop 32, 34 by a compensation value guaranteeing the flow of a minimum current in the diodes 38, 40 of the main amplification branch.

Preferably, the resistor 54, 56 is very large and notably at least one hundred times greater than the value of the resistors 34, 36. Thus, the value of the resistors 54, 56 is for example equal to 100 kOhms.

As an alternative not shown, the diodes 46, 48 and the current sources 50, 52 are replaced with a voltage source positioned instead of and in the place of the diodes 46, 48, the diodes 38, 34 remaining in place as well as the resistors 54, 56. In this case, the current flowing through the transistors 18, 20 converges towards zero without ever reaching this value.

According to a further alternative embodiment, the current sources 50, 52 are retained and the diodes 38, 40, 46, 48 are each replaced with a MOSFET transistor for which the gate is connected to the drain. Such a transistor then has a non-linear response, like a diode, thereby ensuring operation of the circuit like in the previous embodiments.

In FIG. 2, it is seen that for a substantially sinusoidal amplified signal measured at the output and illustrated on curve 214. The current flowing in the diodes 38 and 40 illustrated by the curves 238 and 240 have, on half the period of the signal illustrated by 240A, a substantially sinusoidal shape and on the other period half illustrated by 240B, a continuously differentiable portion comprised between 2 and 15 milliamperes, without this value ever being cancelled out, which guarantees absence of blocking of the transistor mounted in series with the diode.

Thus, a current of the same shape illustrated by curves 318 and 320 flows through the transistors 18 and 20, making it possible that none of them is ever blocked.

Such an amplifier thus gives the possibility of having significant power while guaranteeing good quality of the output signal, none of the transistors ever being blocked, and low static dissipation of energy.

It is understood that by resorting to the reference diodes 46, 48 through which an imposed current flows, it is possible to set the current flowing through the diodes 38, 40 and therefore to the transistors 18 and 20 without being aware of the temperature-dependent curves of the diodes used.

Such an amplifier is particularly suitable for high fidelity but also finds application in any type of amplifier requiring strong linearity such as a radio amplifier, a medical imaging amplifier or a source amplifier.

The invention claimed is:

1. A linear amplifier including an input and an output, comprising:
    a main amplification branch including two amplification transistors mounted in opposite series between two supply voltages ($V^+$ and $V^-$), the output of the amplifier being connected between both transistors, and
    a control circuit for each amplification transistor connected to the input for each receiving as in input the signal to be amplified,
    wherein the main amplification branch includes, between each transistor and the output, a unit with a non-linear response and means for introducing at the input of the control circuit for each transistor a non-linear compensation signal able to impose the flow of a minimum current in the unit with a non-linear response, the means for introducing the non-linear compensation signal include:
    a second non-linear unit identical with said non-linear unit connected between a corresponding terminal of said non-linear unit and a current source imposing a current in said second non-linear unit, and
    a voltage measurement branch connected to the other terminal of the second non-linear unit, which voltage measurement branch is connected to the control circuit in order to provide said non-linear compensation signal.

2. The amplifier according to claim 1, wherein said unit with a non-linear response is a diode.

3. The amplifier according to claim 1, wherein said unit with a non-linear response is a transistor of the MOS type.

4. The amplifier according to claim 1, wherein the means for introducing the non-linear compensation signal include:
    a voltage source, a terminal of which is connected between each amplification transistor and the unit with a non-linear response, and
    a voltage measurement branch connecting the other terminal of the voltage source to the control circuit for the transistor.

5. The amplifier according to claim 1, wherein the amplifier includes a linear feedback loop, connecting the current output to the input of each control circuit.

6. The amplifier according to claim 5, wherein
    the voltage measurement branches and the linear feedback loop are connected together at the input of the control circuit.

7. The amplifier according to claim 6, wherein the value of the resistor of the voltage measurement loop is at least one hundred times greater than the value of the resistor of the linear feedback loop.

8. The amplifier according to claim 1, wherein each control circuit includes an operational amplifier, the non-inverting input of which is connected to the input of the amplifier and the inverting input of which is connected to the means for introducing the non-linear compensation signal.

\* \* \* \* \*